United States Patent [19]

Dallabora et al.

[11] Patent Number: 4,888,497

[45] Date of Patent: Dec. 19, 1989

[54] GENERATOR OF RESET PULSES UPON THE RISE OF THE POWER SUPPLY FOR CMOS-TYPE INTEGRATED CIRCUITS

[75] Inventors: Marco Dallabora, Melegnano; Roberto Gastaldi, Milan, both of Italy; David Novosel, New Wilmington, Pa.

[73] Assignee: SGS Thomson Microelectronics spa, Catania, Italy

[21] Appl. No.: 187,581

[22] Filed: Apr. 28, 1988

[30] Foreign Application Priority Data

May 7, 1987 [IT] Italy ................ 20420 A/87

[51] Int. Cl.4 .............. H03K 17/22; H03K 17/20; H03K 17/687; H03K 5/153

[52] U.S. Cl. .................. 307/272.3; 307/290; 307/603

[58] Field of Search ............ 307/296.4, 296.5, 296 R, 307/297, 592, 594, 603, 290, 200 B, 362, 272.3

[56] References Cited

U.S. PATENT DOCUMENTS

| | | | |
|---|---|---|---|
| 3,985,970 | 10/1976 | Lerault et al. | 307/290 X |
| 4,023,122 | 5/1977 | Oura | 307/290 X |
| 4,461,963 | 7/1984 | Koomen | 307/290 X |
| 4,560,889 | 12/1985 | Hayashi | 307/290 |
| 4,682,049 | 7/1987 | Kirschner et al. | 307/290 X |
| 4,716,322 | 12/1987 | D'Arrigo et al. | 307/592 |
| 4,788,454 | 11/1988 | Tanagawa et al. | 307/296 R |
| 4,791,809 | 12/1988 | Schmidt | 307/290 X |

Primary Examiner—Stanley D. Miller
Assistant Examiner—David R. Bertelson
Attorney, Agent, or Firm—Wolf, Greenfield & Sacks

[57] ABSTRACT

The generator has an input stage (I) including a voltage divider for dividing the voltage between the power supply and the ground, having a node constituting the output of the input stage, and by a positive-feedback threshold loop, driven by another node of the voltage divider to make the voltage in the output node rise sharply when the voltage in the other node exceeds a threshold. A first Schmitt trigger (T1) is driven by the voltage rise front supplied by the input stage; and a former of output pulses (F) comprising a second Schmitt trigger (T2) is driven by circuit means adapted to directly apply to the second Schmitt trigger the voltage front arriving from the first Schmitt trigger and to restore the original voltage level with a preset delay.

9 Claims, 1 Drawing Sheet

GENERATOR OF RESET PULSES UPON THE RISE OF THE POWER SUPPLY FOR CMOS-TYPE INTEGRATED CIRCUITS

BACKGROUND OF THE INVENTION

1. Field of the Invention

The present invention relates to a generator of reset pulses upon the rise of the power supply (power-on reset), for CMOS-type integrated circuits.

2. Prior Art

In a large variety of integrated circuits, a series of initialization operations is required when the circuit is switched on or restarts its operation after an accidental and unforeseen power cut. For devices to which an external clock on which to synchronise these operations is not supplied, a power-on reset circuit, adapted to generate one or more pulses which start the initialization operations (reset pulses) is required.

For good operation, a power-on reset generator must correctly react whether the supply voltage rises slowly or sharply. This constitutes a problem, due to the difficulty of producing a circuit which detects with the same certainty transitions with widely different rise times.

Power-on reset generators are furthermore required not only to act at the moment on initial switching on, but also in the case of successive brief power interruptions, which may have corrupted the data stored in the circuit. On this subject, the minimum time of duration of the power supply interruption (minimum break-time) is critical. The recovery time, i.e. the minimum time required by the generator to reset to conditions capable of intervening in the case of a new break, is also critical. In the CMOS integrated circuits being dealt with, it is also important that the current consumption be as reduced as possible.

Known power-on circuits achieve one or the other of the abovesaid purposes, but not all thereof simultaneously, showing shortcomings either for the excessive consumption of current, or for the excessively long recovery time, or for the narrow range of accepted rise times.

SUMMARY OF THE INVENTION

The essential aim of the invention is therefore to provide a power-on reset generator of the type described above, which simultaneously satisfies all the abovementioned requirements to a greater extent than known circuits.

The above described aim, together with other objects and advantages which will become apparent hereinafter, are achieved by the invention with a generator of power-on reset pulses upon the rise of the power supply, the CMOS-type integrated circuits, characterized in that it comprises:

(a) an input stage including means for dividing the voltage between the power supply and ground, having a node constituting the output of the input stage, and by a positive-feedback threshold loop, driven by another node of the divider means to cause a sharp rise of the voltage in the output node when the voltage in the other node exceeds a threshold;

(b) a first Schmitt trigger driven by the voltage rise front supplied by the input stage;

(c) a former of output pulses comprising a second Schmitt trigger driven by circuit means adapted to directly apply to the second Schmitt trigger the voltage front arriving from the first Schmitt trigger and to restore the original voltage level with a preset delay.

BRIEF DESCRIPTION OF THE DRAWINGS

A preferred embodiment of the invention, given by way of example, is now described with reference to the accompanying drawings, wherein.

DETAILED DESCRIPTION OF THE PREFERRED EMBODIMENTS

Figure 1:
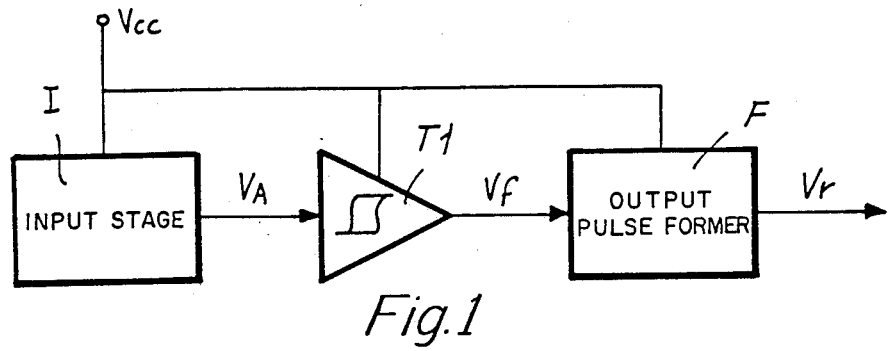
FIG. 1 is block diagram of the generator according to the preferred embodiment of the invention.

With reference to FIG. 1, the generator according to the preferred embodiment of the invention comprises an input stage I, fed and driven by the supply voltage $V_{cc}$ (typically 5V), which generates a voltage signal $V_A$ to drive a Schmitt trigger T1, the output voltage front $V_f$ whereof drives in turn an output pulse former F, the output signal whereof $V_r$ constitutes the desired power-on reset pulse.

Figure 2:
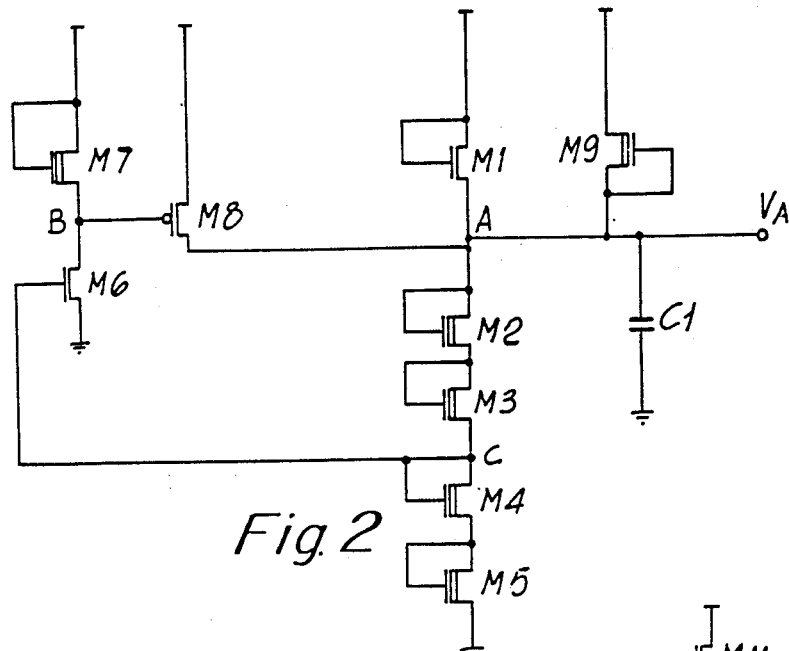
FIG. 2 is a circuit diagram of an input stage of the generator of FIG. 1.

The detailed diagram of the input stage I is shown in FIG. 2. A chain of five transistors, respectively M1, M2, M3, M4, M5, all diode-connected, act as means for dividing the voltage between the power supply $V_{cc}$ and the ground. The transistors M2, M3, M4, M5 are natural, while the transistor M1 is of the LVS type, with high resistance, to reduce the current in the divider. The node C between the transistors M3 and M4 is connected to the gate of a transistor M6, with source connected to the ground and drain leading to the power supply $V_{cc}$ through a diode-connected load transistor M7.

The drain B of the transistor M6 drives the gate of a P-channel transistor M8, the source whereof is biased by the node A between the transistors M1 and M2, which node in turn is connected to the node between a diode-connected transistor M9 and a capacitor C1 towards the ground.

When $V_{cc}$ rises starting from zero, the voltages $V_A$ and $V_c$ in the nodes A and C rise according to the division imposed by the chain of transistors M1-M5. When the node C reaches the threshold value of the transistor M6 (this occurring for values of $V_{cc}$ generally comprised between 3.5 and 4.5V), a positive feedback is triggered which causes the sharp rise of the voltage $V_A$ approximately to $V_{cc}$.

The Schmitt trigger T1 detects the state transition of the input stage I, switching its own output $V_f$ to a low value.

Figure 3:
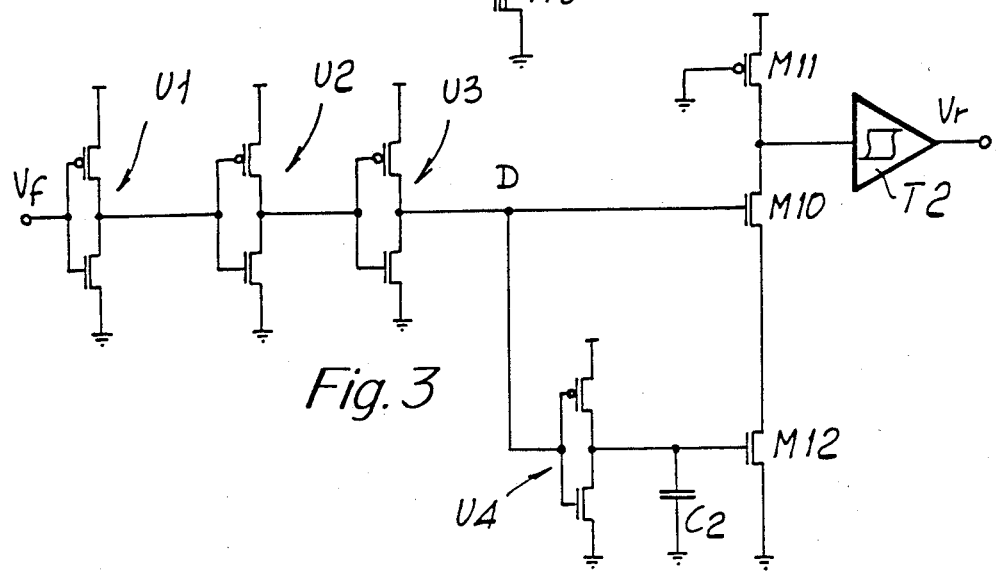
FIG. 3 is a circuit diagram of an output pulse former constituting a part of the generator of FIG. 1.

In the former of output pulses F, the circuit diagram whereof is shown in FIG. 3, a cascade of three inverters U1, U2, U3 acts as delay means for the voltage front $V_f$ arriving from the Schmitt trigger T1 (not shown in FIG. 3). The output node of inverter U3 is connected at one side to the gate of a transistor M10 leading to a P-channel load transistor M11, on the other to the input of an inverter U4 with a capacitor C2 shunted on the output, again acting as a delay circuit, which drives a transistor M12 in series with transistor M10. The drain of transistor M10 drives a final Schmitt trigger T2 which supplies at its output the pulse $V_r$.

In the circuit of FIG. 3, transistor M10 is normally "off", while transistor M12 is "on", therefore the source of transistor M11 is normally high. When the gate of transistor M10 rises, the source of transistor M11 drops, making the trigger T2 switch. With delay determined by inverter U4 and capacitor C2, the transistor M9 is subsequently switched "off", interrupting the current towards the ground in the transistor M11, and thus making the source thereof rise again, with consequent re-switching of the trigger T. Thus the trigger T2 is switched twice by the same front, first by direct effect of the signal on the transistor M10, then by delayed effect through the transistor M12. The result is a pulse having a duration which depends on the delay introduced by inverter U4 and capacitor C2.

The Schmitt triggers T1 and T2 are both of a conventional type, known in the field.

For rising $V_{cc}$, the input stage has high impedance, with the time constant of the node A depending on the series connection of the transistors M1–M5 and on the capacitor C1, which appropriately delays the switching of the trigger T1. This delay is essential to ensure that the trigger T1 is correctly reset, even for extremely rapid wavefronts, with its output at high logical level. The circuit is thus capable of reacting to steeper fronts than those actually allowed by the parasite capacities associated with the supply node.

For dropping $V_{cc}$, the input stage has a very low impedance, since transistor M9 rapidly discharges the node A, and the Schmitt trigger T1 is reset to a condition for generating a new pulse when $V_A$ assumes the value of the negative tripping threshold.

It should be furthermore noted that in the pulse former of FIG. 3 there are no conductive paths between the power supply and ground except during the generation of the pulse. In the input stage, normally only the divider (transistor M1–M5) absorbs current, but this current is small, by virtue of the high resistance of transistor M1. The Schmitt triggers T1 and T2 do not consume power except during switching. Therefore the total consumption of the circuit is extremely reduced.

A preferred embodiment of the invention has been described, but it is understood that it is susceptible to equivalent modifications and variations on the part of the expert in the field, according to the given teachings, without thereby abandoning the scope of the inventive concept.

We claim:

1. A power-on reset circuit comprising:
an input stage including a voltage divider means coupled across a power supply and having a node defining the output of the input stage and a feedback node coupled to said output node through a positive feedback threshold loop for providing a rise of voltage at said output node when the voltage at said feedback node exceeds a predetermined threshold,
a first trigger circuit driven from the output of the input stage, and
a pulse generator comprising an input circuit means and a second trigger circuit driven from said input circuit means, the circuit means coupling the signal from the first trigger circuit to restore the original voltage level,
wherein said positive feedback loop includes a pair of transistors one of which is a P-channel transistor.

2. A power-on reset circuit as described in claim 1 wherein the input circuit means of the pulse generator includes a transistor coupled to the second trigger circuit and a delay circuit coupled from the first trigger circuit for controlling the gate of said transistor.

3. A power-on reset circuit as described in claim 2 wherein said trigger circuits are each a Schmitt trigger.

4. A power-on reset circuit as described in claim 3 wherein said delay circuit includes an inverter and associated shunt capacitor.

5. A power-on reset circuit as described in claim 3 wherein said delay circuit includes a cascade of inverters.

6. A power-on reset circuit as described in claim 1 wherein said input circuit means of the pulse generator includes a delay circuit for providing a preset delay.

7. Generator of power-on reset pulses upon the rise of the power supply, for CMOS-type integrated circuits comprising:
an input stage including means for dividing the voltage between the power supply and ground, having a node defining the output of the input stage, and a positive-feedback threshold loop, driven by another node of said divider means to cause the sharp rise of the voltage in said output node when the voltage in said other node exceeds said threshold; a first Schmitt trigger driven by voltage in said output node;
a pulse generator comprising a second Schmitt trigger and circuit means coupled between said second and said first Schmitt trigger, the circuit means including a transistor and a delay circuit, the output of the first Schmitt trigger being connected to the gate of said transistor through a cascade of inverters, to transfer to the input of said second Schmitt trigger a voltage variation at the output of said first Schmitt trigger; said delay circuit being driven by the same voltage variation and switching the conduction state of said transistor with preset delay.

8. Reset pulse generator according to claim 7, characterized in that said delay circuit is an inverter with a capacitor shunted towards ground at its output.

9. A power-on reset circuit comprising:
an input stage including a voltage divider means coupled across a power supply and having a node defining the output of the input stage and a feedback node coupled to said output node through a positive feedback threshold loop for providing a rise of voltage at said output node when the voltage at said feedback node exceeds a predetermined threshold,
a first Schmitt trigger circuit driven from the output of the input stage, and
a pulse generator comprising an input circuit means and a second Schmitt trigger circuit driven from said input circuit means, the circuit means coupling the signal from the first trigger circuit to restore the original voltage level.

* * * * *